United States Patent
Curtin

(10) Patent No.: US 8,281,735 B2
(45) Date of Patent: Oct. 9, 2012

(54) SQUEEGEE HOLDER WITH INTEGRATED SELF-CLEANING SLIDING MECHANISM

(75) Inventor: Mark Curtin, Kaneohe, HI (US)

(73) Assignee: Transition Automation, Inc., Tyngsboro, MA (US)

( * ) Notice: Subject to any disclaimer, the term of this patent is extended or adjusted under 35 U.S.C. 154(b) by 942 days.

(21) Appl. No.: 12/266,930

(22) Filed: Nov. 7, 2008

(65) Prior Publication Data

US 2009/0133208 A1 May 28, 2009

Related U.S. Application Data

(60) Provisional application No. 60/986,738, filed on Nov. 9, 2007.

(51) Int. Cl.
| | |
|---|---|
| B05C 11/02 | (2006.01) |
| B05C 13/00 | (2006.01) |
| B05C 13/02 | (2006.01) |
| B05C 1/00 | (2006.01) |
| B05C 11/00 | (2006.01) |
| B41F 35/00 | (2006.01) |
| B41L 41/00 | (2006.01) |
| A46B 15/00 | (2006.01) |
| B21B 45/02 | (2006.01) |
| B60S 1/28 | (2006.01) |

(52) U.S. Cl. ........ 118/120; 118/104; 118/203; 118/207; 118/665; 118/56; 101/425; 15/104.069; 15/256.5; 15/256.53

(58) Field of Classification Search ............... 118/104, 118/120, 203, 207, 665, 56; 101/425; 15/104.069, 15/250.5, 250.53
See application file for complete search history.

(56) References Cited

U.S. PATENT DOCUMENTS

| | | | |
|---|---|---|---|
| 3,071,069 A | 1/1963 | Sherman | |
| 4,146,484 A | 3/1979 | Campbell | |
| 4,273,655 A | 6/1981 | Reid | |
| 4,498,988 A | 2/1985 | Fujita et al. | |
| 4,711,564 A * | 12/1987 | Mugrauer et al. | 15/256.52 |
| 5,461,781 A | 10/1995 | Pirc | |
| 5,550,622 A | 8/1996 | Tange | |
| 5,802,970 A | 9/1998 | Tani | |
| 6,022,192 A | 2/2000 | DeLaHoz et al. | |
| 6,640,712 B2 | 11/2003 | Corti et al. | |
| 6,659,002 B2 | 12/2003 | Langdon et al. | |
| 6,698,346 B2 | 3/2004 | Shimizu et al. | |
| 2007/0062386 A1* | 3/2007 | Curtin et al. | 101/123 |

FOREIGN PATENT DOCUMENTS

JP 11198347 7/1999

* cited by examiner

*Primary Examiner* — Dah-Wei Yuan
*Assistant Examiner* — Binu Thomas
(74) *Attorney, Agent, or Firm* — Gesmer Updegrove LLP

(57) ABSTRACT

A squeegee holder including a self-cleaning sliding mechanism, a squeegee blade, two end caps at each end of the squeegee blade. The end caps include a flange and a hole. Two actuating motors are attached to the flanges, the motors include drive shafts pointing downwards. A wiper blade is attached to a blade mount slidable along the squeegee blade and a drill rod is secured at each end with press fittings into the holes in the end caps.

13 Claims, 5 Drawing Sheets

SQUEEGEE HOLDER WITH INTEGRATED SELF-CLEANING SLIDING MECHANISM

PRIORITY INFORMATION

This application claims the benefit of U.S. Patent Application Ser. No. 60/986,738 filed on Nov. 9, 2007.

BACKGROUND OF THE INVENTION

1. Field of the Invention

The invention relates to a method to provide an integrated self-cleaning function to a squeegee which is used in Surface Mount Technology Solder Paste Printing.

2. Description of the Prior Art

There are a growing assortment of printed materials used throughout industry and especially in Electronics Manufacturing. Currently there are a host of new solder paste formulations, which happen to express high levels of adhesion to their own mass or to surrounding printing components such as metal squeegees and stencil surfaces.

A significant problem is maintaining solder paste in a known preferred position inside the printing machine. This mass of paste is transferred back and forth across a stencil surface, by alternating action of two squeegees. Typically, the solder paste does not remain in the ideal cylinder geometry, but rather becomes distorted, and stretched out when each squeegee finishes its printing stroke and raises up in the clearance position. This results in a loss of quality and dependability: the main solder paste mass, after adhering to one squeegee may be depleted of enough quantity to print again. The paste which adheres to the squeegee results in undesirable drying. It is thus most desirable to maintain the solder paste in the minimum area of surface exposure and contact with machine elements.

Cleaning the squeegee blade is a key part of the process. It is important to keep the blade free of dripping solder paste.

There have been other mechanisms to clean the solder paste, however they have not worked as desired and the mechanisms have been not been reliable. While still other cleaning mechanisms may not be able to be retrofitted to older pieces of equipment and thus increase the cost of using what might be a useful piece of equipment.

SUMMARY OF THE INVENTION

In accordance with an embodiment, the invention provides a integrated self-cleaning function added to a squeegee used in Surface Mount Technology Solder Paste Printing (SMT printing equipment). The device is comprised of a squeegee holder having a squeegee blade along with two paste retainers or end caps. The end caps are modified to have flanges extending out horizontally. Two actuating motors have their drive shafts pointing downward.

This is a unique way to maintain a clean squeegee blade free of dripping solder paste. The design can be retrofitted onto existing SMT printing equipment.

BRIEF DESCRIPTION OF THE DRAWINGS

Other features and advantages of the present invention will now be described in greater detail with reference to the accompanying drawings, wherein.

DESCRIPTION OF THE INVENTION

Figure 2:
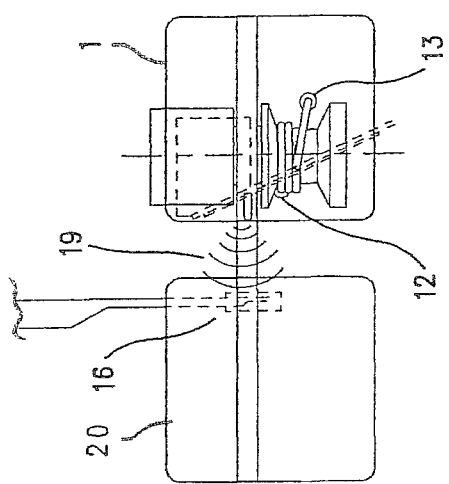
FIG. 2 is an end view illustrating a wire wrapping around a spool.
Figure 1:
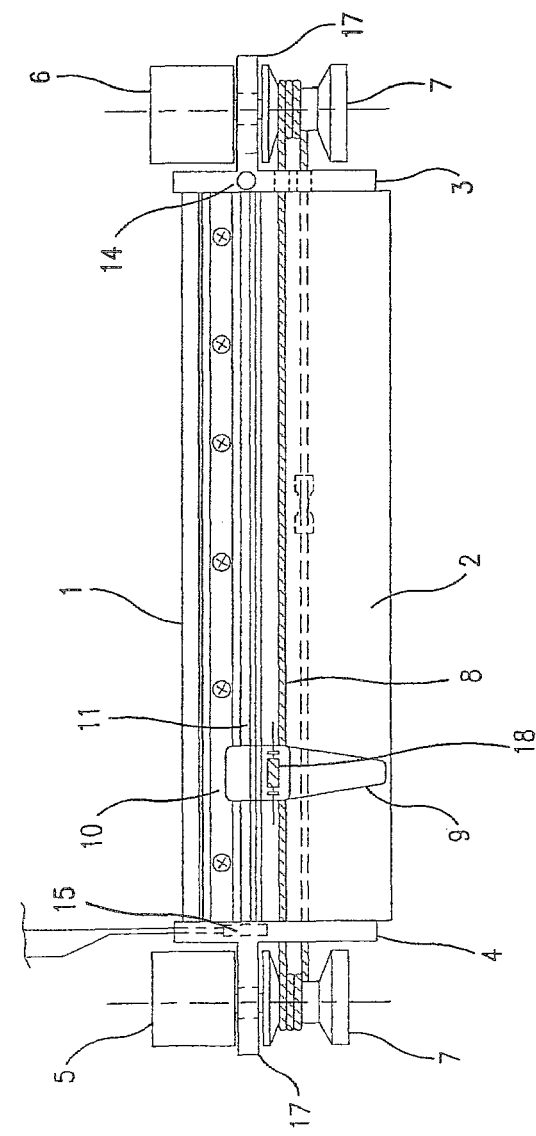
FIG. 1 is a top view of one squeegee holder configured in accordance with the invention.

In accordance with an embodiment, the invention provides an integrated self-cleaning function to a squeegee used in Surface Mount Technology Solder Paste Printing. Initially as shown in FIGS. 1 and 2, the device is comprised of a squeegee holder (1) that contains normally a squeegee blade (2) along with two end caps (3), (4), which are typically referred to as "paste retainers". The end caps in the design disclosed herein are modified to have flanges (17) which extend out horizontally, and which have attached two actuating motors (5), (6). The motors have their drive shafts pointing downward.

The cleaning function is enabled by a small thin wiper blade (9) which is attached to a blade mount (10) which slides along the squeegee blade, from one end of the squeegee blade to the other (and vice versa). The blade mount (10) is guided by a small ⅛ inch diameter drill rod (11) which is secured at each end by press fittings into two holes, one in each end cap (3) and (4). The blade mount is moved by means of a thin wire (8). The motion of the wire is accomplished by the motors and two spools (7). The wire wraps around each spool (7), and is attached to the sliding blade mount (10) at (18). By wrapping the wire around each spool, feeding the wire through guide holes (12) and (13), and securing the wire in tension with a crimp behind the squeegee blade, (2), the mechanism achieves a sliding motion and force which causes the wiper blade (9) to cut through any solder paste which remains on the squeegee blade (2) after a print stroke has been made.

A unique way to maintain a clean squeegee blade, free of dripping solder paste by way of a thin wire and sliding blade and mount assembly along with a guide rod. It accomplishes the cleaning function without introducing a significant additional surface area onto which the solder paste can adhere, and also: what solder paste does adhere is wiped clean off the wire and blade by the two guide holes (12) and (13). The blade which does the wiping will have a small amount of solder paste which remains adhered after each cleaning cycle however this is a small amount compared to the amount which is removed from the region of the squeegee blade which has been wiped clean. The wire wrapped around the spools enables the mechanism to be driven a fixed duration of time, so that the wiper blade reaches the end cap, and is forced against the end cap to stop, while the spool continues to turn and the wire slips on the spool. This offers a simple self-stopping function by way of this end-stop-slip concept, thereby eliminating the need for sophisticated optical encoders and motor position feedback functions.

The self cleaning function is initiated by the relative motion between two opposing squeegee holder assemblies, which both include a magnet (14) and a reed switch (15). When the two squeegees are facing each other as is normal in most SA4T printing machines, the magnet on squeegee holder (1) induces a magnetic field (19) on the reed switch (16) of a facing squeegee holder (20) as shown in FIG. 2.

This is unique in its ability to be covered with solder paste and still be operable. The magnets, reed switches and wire and spool designs can tolerate adhesion of solder paste without interruption of the self-cleaning function. The design is highly compact and utilizes the existing longitudal structure of the squeegee holder, with the addition of a guide rod (11) to accomplish a cleaning function which greatly improves solder paste printing by eliminating the sticking and clogging of the squeegees with solder paste after each print stroke.

The motors are controlled by a microprocessor which receives each reed switch signal, and then turns on both motors simultaneously in one direction of rotation for a fixed amount of time which is slightly longer than the time required for the blade (9) to complete the transit from one end of the squeegee blade to the other. When another reed switch signal is triggered, the motors are actuated in a reverse direction simultaneously causing the sliding blade to transit in the opposite direction from one end of the squeegee blade to the other. A single microprocessor is used to control two self-cleaning squeegee mechanisms.

The design provides unique utility in the ability to retrofit onto existing SMT printing equipment without having to be integrated into the electronics of the SMT machines. This is accomplished by the reed-switch/magnet combination which causes a signal (switch open/closure), when each squeegee is actuated up after the end of each print stroke. The passing of the magnet upward, past two consecutive reed switches, indicated both the upward direction of the squeegee and the end of the print stroke, which is the point in time where a clean cycle is to be initiated.

In the control of the sliding wiper blade, the controller may be programmed to clean once, or multiple times for each stroke of the squeegee blade. Further, an electronic scale may be adapted into the squeegee holder which senses the amount of solder paste adhering to the squeegee. A user settable threshold may be input into the controller, and when this threshold is exceeded, a clean cycle is initiated only at this time. In this embodiment, the self-cleaning squeegee actuates the minimum number of times necessary, to improve the life and reduce the wear and fatigue to the system.

The self-cleaning squeegee system may also have end of stroke switches which signal to the controller that the sliding wiper blade has reached the end of the stroke. The slider wiper blade may be oriented flush with the squeegee blade, or may be biased to have a spring load against the squeegee blade. In certain cases, a spring bias may be required to affect a clean wipe of the solder paste off the squeegee blade.

To remove any solder paste which may remain stuck to the slider wiper blade, a "nest" may be added to each end-cap which is a negative physical shape of the slider blade and mount. When the slider blade and mount reach the end of the squeegee blade stroke, they insert into this negative nest area, and this causes residual solder paste to be wiped off the slider blade.

In this system, the acceleration and speed of the sliding wiper blade are controlled in such a way as to affect the best cleaning action, without interfering with the print cycle of the SMT printer.

In the current embodiment, the tensioned wire is maintained taught by a spring which connects the two ends of the wire which are looped and secured. Also, in the current embodiment, the wire wraps around the spools three times on each side. The rear feed hole that guides the wire to the back side of the squeegee is positioned in such a way as to keep the wire free of tangles when the spools are turning and the wire is transferring around the spools and moving the sliding wiper blades.

The controller has two DC output leads, which drive the motors in parallel for one squeegee, (and two additional DC output leads which drive the motors of the other squeegee in parallel). For each squeegee the controller has two feedback signals coming from the reed switches, and one ground line, which is used as a sensor ground for each reed switch. In the current embodiment, the controller then has a total of (4) power outputs (two pairs, one for each motor) and (4) signals (two reed switch feedbacks for each squeegee) and (2) signal grounds going to each pair of reed switches.

Figure 3:
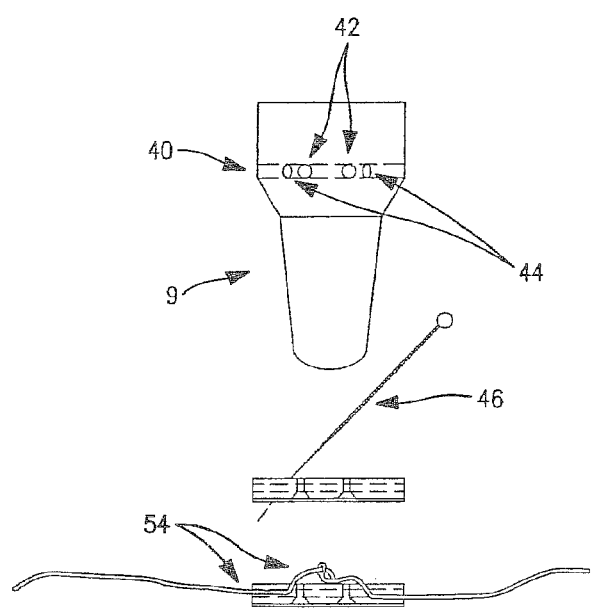
FIG. 3 illustrates the slider assembly.

FIG. 3 illustrates slider assembly instructions showing the existing cross hole at (40), end screws (42) and new holes (44) in the front face. A needle (46) with a heated tip makes a hole to meet an inside hole. The hole should not pass through the slider but only meet the other hole. Additionally the feed line (54), "hops" over the screws and is tied in a knot.

Figure 4:
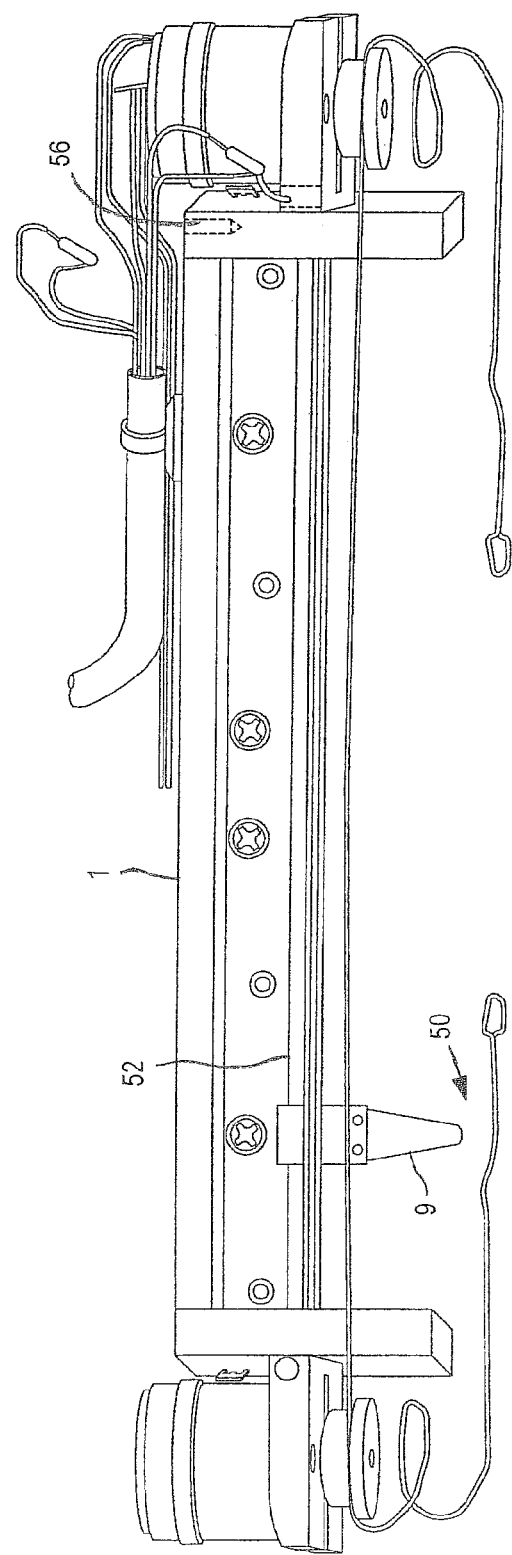
FIG. 4 is an illustration of the device.

FIG. 4 is a more isometric diagrammatic view of the squeegee holder (1). Shown at (50) is the feed of a continuous a length of wire through a tine hole on the slider with the blade mount, which then moves through a plastic side mount (small hole) and around each spool two times. The wire goes through a larger hole on the backside leading to the back side of the squeegee. Shown at (52) is the ⅛ inch diameter drill rod to span the length of the squeegee holder terminating inside the plastic endcaps. Some epoxy may be used to secure the rod in place. Shown at (56) is a new hole that may be drilled to add a second reed switch which may be triggered by the same magnet.

Figure 5:
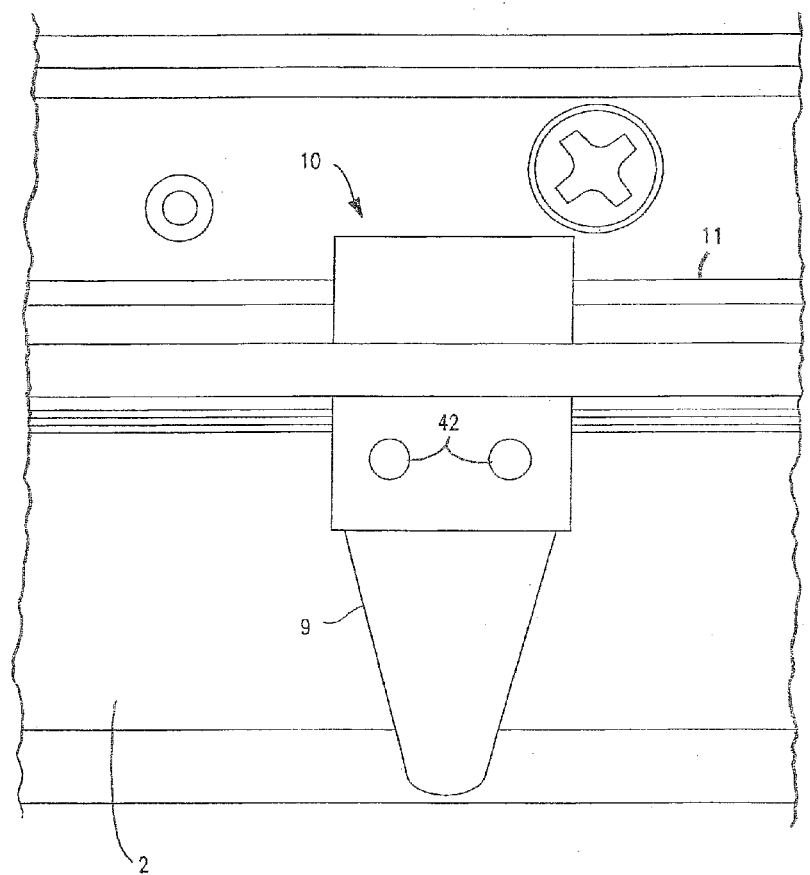
FIG. 5 illustrated the wiper blade in place.
Figure 6A:
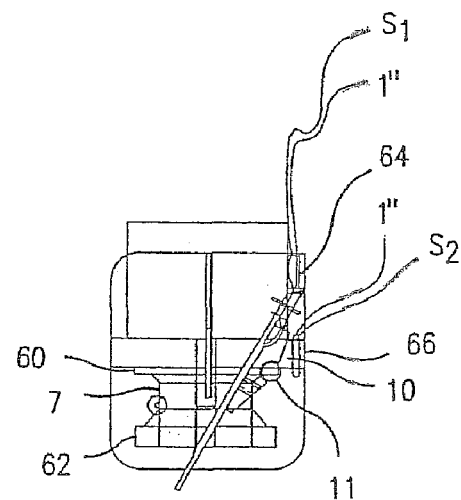
FIGS. 6A and B illustrate some of the workings of the device.
Figure 6B:
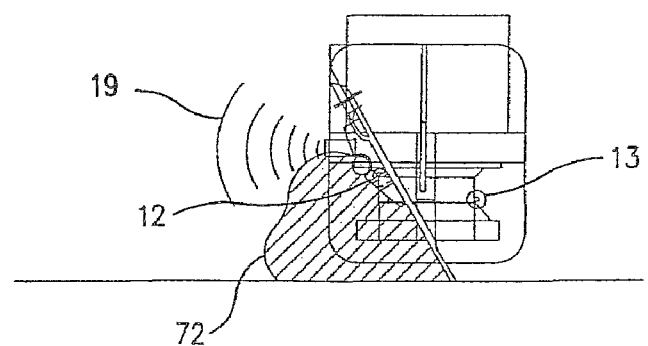

FIG. 5 shows an enlarged view of the wiper blade mount (10). FIGS. 6A and 6B illustrate some of the working portions of the mechanism. FIG. 6A shows the spool (7) having a spool top lip (60) and a spool bottom lip (62). The slider blade mount is shown at (10). The reed sensor ($S_1$), e.g., about 1" in length, on the left squeegee is shown at (64) along with the reed sensor left (S2), e.g., about 1" in length as shown at (66). FIG. 6B illustrates the solder paste (72) being printed. The rear guide hole (13) is for the wire located lower than the front guide hole to avoid wire tangling. Also illustrated is the magnetic field (19) which is created to control the device.

The wiper blade is made of a thin, approximately 0.010 inch spring steel blade, which is shaped as shown in FIGS. 1, 3 and 5.

It will be apparent to those skilled in the art that the present invention may be embodied in may other specific forms without departing from the spirit or scope of the invention. Therefore, the present embodiment is to be considered as illustrative and not restrictive and the invention is not to be limited to the details given herein, but may be modified within the scope of the appended claims.

What is claimed is:

1. A squeegee holder including a self-cleaning sliding mechanism, said squeegee holder comprising:
    a squeegee blade having a longitudinal axis;
    two end caps at each end of the squeegee blade such that each said end cap includes a flange and a hole and is located at one end of the longitudinal axis of the squeegee blade;
    two actuating motors, each of which is attached to one flange wherein the motors include drive shafts pointing in a direction orthogonal to the longitudinal axis;
    a wiper blade attached to a blade mount slidable along the squeegee blade; and
    a guide rod secured at each end of the longitudinal axis with press fittings into the holes in the end caps, and along which the wiper blade is configured to reciprocally travel adjacent the squeegee blade between the end caps.

2. The squeegee holder of claim 1 wherein the blade mount moves with a wire, the wire wraps around a spool attached to the flange, such that the moving wire wraps around each spool, and said wire is attached to the slidable blade mount.

3. The squeegee holder of claim 1 wherein the wire is fed through guide holes securing the wire in tension behind the squeegee blade, thereby achieving a sliding motion and force causing the wiper blade to cut through any solder paste remaining on the squeegee blade after a print stroke has been completed.

4. The squeegee holder of claim 1 further comprising a magnet and reed switch, whereby the magnet induces a magnetic field on the reed switch to initiate relative motion between opposing squeegee holder assemblies.

5. The squeegee holder of claim 4 further comprising a microprocessor to control the motors which receive a reed switch signal, to turn on the two motors simultaneously in one directions of rotation.

6. A squeegee holder including a self-cleaning sliding mechanism, said squeegee holder comprising:
- a squeegee blade having a longitudinal axis;
    - two end caps at each end of the squeegee blade such that each said end cap is located at one end of the longitudinal axis of the squeegee blade;
- at least one actuating motor that is attached to one flange wherein the motor includes a drive shaft pointing in a direction orthogonal to the longitudinal axis;
- a guide rod secured at each end of the longitudinal axis; and
- a wiper blade that is attached to a blade mount that is slidable along the guide rod by actuation of the at least one actuating motor to provide that the wiper blade is configured to reciprocally travel between the end caps adjacent the squeegee blade.

7. The squeegee holder of claim 6, wherein said squeegee holder further includes two actuating motors that are each attached to one flange, wherein each motor includes a drive shaft pointing in the direction orthogonal to the longitudinal axis.

8. The squeegee holder of claim 1 further comprising a magnet and reed switch, whereby the magnet induces a magnetic field on the reed switch to initiate relative motion between opposing squeegee holder assemblies.

9. The squeegee holder of claim 8 further comprising a microprocessor to control the motors which receive a reed switch signal, to turn on the two motors simultaneously in one directions of rotation.

10. A squeegee holder including a self-cleaning sliding mechanism, said squeegee holder comprising:
- a squeegee blade having a longitudinal axis;
    - two end caps at each end of the squeegee blade such that each said end cap is located at one end of the longitudinal axis of the squeegee blade;
- at least one actuating motor that is attached to one flange wherein the motor includes a drive shaft pointing in a direction orthogonal to the longitudinal axis;
- a drive wire that is reciprocally movable about the drive shaft, wherein the drive wire is maintained in tension;
- a guide rod secured at each end of the longitudinal axis on a front side of said squeegee blade; and
- a blade mount that is attached to the drive wire and is slidable along the guide rod, wherein a wiper blade is attached to the blade mount such that the wiper blade is configured to reciprocally travel between the end caps adjacent the front side of the squeegee blade.

11. The squeegee holder of claim 10, wherein said squeegee holder further includes two actuating motors that are each attached to one flange, wherein each motor includes a drive shaft pointing in the direction orthogonal to the longitudinal axis.

12. The squeegee holder of claim 10 further comprising a magnet and reed switch, whereby the magnet induces a magnetic field on the reed switch to initiate relative motion between opposing squeegee holder assemblies.

13. The squeegee holder of claim 12 further comprising a microprocessor to control the motors which receive a reed switch signal, to turn on the two motors simultaneously in one directions of rotation.

* * * * *